United States Patent
Ali et al.

(10) Patent No.: US 12,176,260 B2
(45) Date of Patent: *Dec. 24, 2024

(54) PASSIVE THERMAL-CONTROL SYSTEM OF AN ELECTRONIC SPEAKER DEVICE AND ASSOCIATED ELECTRONIC SPEAKER DEVICES

(71) Applicant: Google LLC, Mountain View, CA (US)

(72) Inventors: Ihab A. Ali, Cupertino, CA (US); Emil Rahim, San Jose, CA (US); Truong Ho Cong, San Jose, CA (US)

(73) Assignee: Google LLC, Mountain View, CA (US)

( * ) Notice: Subject to any disclaimer, the term of this patent is extended or adjusted under 35 U.S.C. 154(b) by 30 days.

This patent is subject to a terminal disclaimer.

(21) Appl. No.: 17/979,176

(22) Filed: Nov. 2, 2022

(65) Prior Publication Data

US 2023/0052653 A1 Feb. 16, 2023

Related U.S. Application Data

(63) Continuation of application No. 17/065,285, filed on Oct. 7, 2020, now Pat. No. 11,521,909.

(Continued)

(51) Int. Cl.
*H05K 7/20* (2006.01)
*H01L 23/367* (2006.01)
*H04R 1/02* (2006.01)

(52) U.S. Cl.
CPC .......... *H01L 23/3675* (2013.01); *H04R 1/02* (2013.01); *H05K 7/2039* (2013.01); *H05K 7/20481* (2013.01); *H05K 7/20509* (2013.01)

(58) Field of Classification Search
CPC ... H01L 23/3675; H01L 23/552; H01L 25/18; H04R 1/02; H05K 7/2039; H05K 7/20481; H05K 7/20509

(Continued)

(56) References Cited

U.S. PATENT DOCUMENTS 3,991,286 A * 11/1976 Henricksen ............ H04R 9/022
381/189
4,138,593 A 2/1979 Hasselbach et al.

(Continued)

FOREIGN PATENT DOCUMENTS

CN 102144409 8/2011
CN 103037291 4/2013

(Continued)

OTHER PUBLICATIONS

Extended European Search Report dated Mar. 5, 2021 in EP Patent Application No. 20200820.7.

(Continued)

*Primary Examiner* — Anatoly Vortman
(74) *Attorney, Agent, or Firm* — Kilpatrick Townsend & Stockton LLP

(57) ABSTRACT

This document describes a passive thermal-control system that can be integrated into an electronic speaker device and associated electronic speaker devices. The passive thermal-control system uses an architecture that combines heat spreaders and thermal interface materials to transfer heat from heat-generating electronic devices of the electronic speaker device to a housing component of the electronic speaker device. The housing component dissipates the heat to prevent a thermal runaway condition.

20 Claims, 7 Drawing Sheets

Related U.S. Application Data

(60) Provisional application No. 62/914,891, filed on Oct. 14, 2019.

(58) Field of Classification Search
USPC .......................................... 361/704; 381/397
See application file for complete search history.

(56) References Cited

U.S. PATENT DOCUMENTS

| | | | | |
|---|---|---|---|---|
| 4,210,778 | A * | 7/1980 | Sakurai | F28D 15/0266 |
| | | | | 381/349 |
| 4,811,403 | A * | 3/1989 | Henricksen | H04R 1/02 |
| | | | | 381/397 |
| 5,771,154 | A * | 6/1998 | Goodman | H04R 1/00 |
| | | | | 174/16.3 |
| 5,808,861 | A | 9/1998 | Nakajima et al. | |
| 6,259,798 | B1 | 7/2001 | Perkins et al. | |
| 7,181,039 | B2 * | 2/2007 | Stiles | H04R 1/02 |
| | | | | 381/397 |
| 7,349,207 | B2 * | 3/2008 | Harris | H04R 9/022 |
| | | | | 381/397 |
| 7,957,131 | B1 | 6/2011 | Mongia et al. | |
| 8,130,495 | B2 * | 3/2012 | Field | G10H 3/186 |
| | | | | 361/695 |
| 8,406,450 | B2 * | 3/2013 | Jiang | F28F 1/32 |
| | | | | 381/397 |
| 8,561,756 | B2 * | 10/2013 | Litovsky | H04R 1/02 |
| | | | | 181/198 |
| 8,798,308 | B2 * | 8/2014 | Litovsky | H04R 1/2834 |
| | | | | 381/345 |
| 9,820,373 | B2 * | 11/2017 | Pennathur | H05K 3/284 |
| 10,104,761 | B1 * | 10/2018 | MacDonald | H04R 1/025 |
| 10,187,728 | B2 * | 1/2019 | Oliveira | H04R 1/2826 |
| 10,425,739 | B2 * | 9/2019 | Xu | H04R 9/06 |
| 10,595,105 | B2 | 3/2020 | Amae | |
| 10,681,439 | B2 | 6/2020 | Kim et al. | |
| 10,805,699 | B2 | 10/2020 | Ivey | |
| 11,212,940 | B1 | 12/2021 | Rahim et al. | |
| 11,521,909 | B2 * | 12/2022 | Ali | H04R 1/345 |
| 11,676,912 | B2 * | 6/2023 | Huang | H01L 21/4857 |
| | | | | 257/668 |
| 11,812,583 | B2 * | 11/2023 | Heckmann | H01Q 21/205 |
| 2006/0039571 | A1 * | 2/2006 | Harris | H04R 9/022 |
| | | | | 381/189 |
| 2009/0073654 | A1 | 3/2009 | Beam et al. | |
| 2010/0177482 | A1 | 7/2010 | Spivey | |
| 2010/0309631 | A1 | 12/2010 | Hill et al. | |
| 2013/0141866 | A1 | 6/2013 | Refai-Ahmed | |
| 2013/0177186 | A1 | 7/2013 | Schul | |
| 2015/0382448 | A1 | 12/2015 | Pennathur et al. | |
| 2016/0345086 | A1 | 11/2016 | Chamberlin et al. | |
| 2017/0346650 | A1 | 11/2017 | Eom et al. | |
| 2017/0347172 | A1 | 11/2017 | Kim et al. | |
| 2018/0091901 | A1 | 3/2018 | Stanley et al. | |
| 2018/0343772 | A1 | 11/2018 | Raghupathy et al. | |
| 2019/0021184 | A1 | 1/2019 | Williams et al. | |
| 2019/0104640 | A1 | 4/2019 | Chang et al. | |
| 2020/0112792 | A1 | 4/2020 | Ramones et al. | |

FOREIGN PATENT DOCUMENTS

| | | |
|---|---|---|
| CN | 206547243 | 10/2017 |
| CN | 107852842 | 3/2018 |
| WO | WO 1999003375 | 1/1999 |
| WO | WO 2016045120 | 3/2016 |
| WO | WO 2018125632 | 7/2018 |
| WO | WO 2021072096 | 4/2021 |

OTHER PUBLICATIONS

Extended European Search Report dated Mar. 11, 2021 in EP Patent Application No. 20201375.1.
International Search Report and Written Opinion dated Jan. 29, 2021 in International Patent Application No. PCT/US2020/054810.
Notice of Allowance dated Sep. 1, 2021 in U.S. Appl. No. 16/915,626.
Notice of Allowance dated Sep. 8, 2022 in U.S. Appl. No. 17/065,285.
Notice of Grant dated Sep. 7, 2022 in CN Patent Application No. 202011091326.1.
Office Action dated Mar. 28, 2022 in CN Patent Application No. 202011091326.1.
Office Action dated Apr. 23, 2021 in U.S. Appl. No. 16/915,626.
Office Action dated Jul. 28, 2022 in U.S. Appl. No. 17/065,285.

* cited by examiner

PASSIVE THERMAL-CONTROL SYSTEM OF AN ELECTRONIC SPEAKER DEVICE AND ASSOCIATED ELECTRONIC SPEAKER DEVICES

CROSS-REFERENCE TO RELATED APPLICATIONS

This application is a continuation of U.S. patent application Ser. No. 17/065,285, filed Oct. 7, 2020, which claims the benefit of U.S. Patent Application No. 62/914,891, filed Oct. 14, 2019, each of which is incorporated by reference herein in its entirety.

BACKGROUND

Electronic speaker devices have evolved to perform a variety of functions. Such functions may be related to voice commands spoken to a virtual assistant that may be integrated into an electronic speaker device to retrieve information, manage a home automation system, play media, and so on.

When a form factor of the electronic speaker device is reduced, heat generated from electronic devices of the electronic speaker device can result in a thermal runaway condition that damages the electronic devices. To manage the heat generated from the electronic devices, a passive thermal-control system may be used. However, multiple challenges are presented regarding the design and architecture of an efficient and effective passive thermal-control system that prevents the thermal runaway condition while maintaining the reduced form factor.

SUMMARY

This document describes a passive thermal-control system that can be integrated into an electronic speaker device and associated electronic speaker devices. The passive thermal-control system uses an architecture that combines heat spreaders and thermal interface materials (TIMs) to transfer heat from heat-generating electronic devices of the electronic speaker device to a housing component of the electronic speaker device. The housing component dissipates the heat to prevent a thermal runaway condition.

In some aspects, an electronic speaker device is described. The electronic speaker device includes a housing component that may form a portion of an oblate shell, an acoustic waveguide that is generally elliptical, and a printed circuit board (PCB) that is generally elliptical. The PCB includes a System-on-Chip (SoC) integrated circuit (IC) device and a memory IC device. The electronic speaker device also includes a passive thermal-control system to transfer heat generated by the SoC IC device and the memory IC device to the housing. The passive thermal-control system includes a first heat spreader in thermal contact with the PCB, a second heat spreader in thermal contact with the SoC IC device and the memory IC device, and a third heat spreader that is foldable along a portion of a perimeter of the acoustic waveguide.

In other aspects, a structure for passively controlling heat generated by at least one IC device mounted to a PCB is described. The structure includes an acoustic waveguide that has a heat spreader folded along a portion of a perimeter of the acoustic waveguide such that different portions of the heat spreader are in thermal contact with opposing surfaces of the acoustic waveguide. The structure also includes an electromagnetic interference (EMI) shield that is attached to the PCB and surrounds the at least one IC device. The structure also includes a first TIM that is (i) located between the at least one IC device and a first portion of the heat spreader and (ii) in thermal contact with the at least one IC device and the first portion of the heat spreader. The structure also includes a second TIM that is (i) located between the EMI shield and a second portion of the heat spreader and (ii) in thermal contact with the EMI shield and the second portion of the heat spreader.

The details of one or more implementations are set forth in the accompanying drawings and the following description. Other features and advantages will be apparent from the description, the drawings, and the claims. This summary is provided to introduce subject matter that is further described in the Detailed Description. Accordingly, a reader should not consider the summary to describe essential features nor limit the scope of the claimed subject matter.

BRIEF DESCRIPTION OF THE DRAWINGS

The details of one or more aspects of a passive thermal-control system for an electronic speaker device and associated electronic speaker devices are described below. The use of the same reference numbers in different instances in the figures and drawings may indicate like elements.

DETAILED DESCRIPTION

Figure 1:
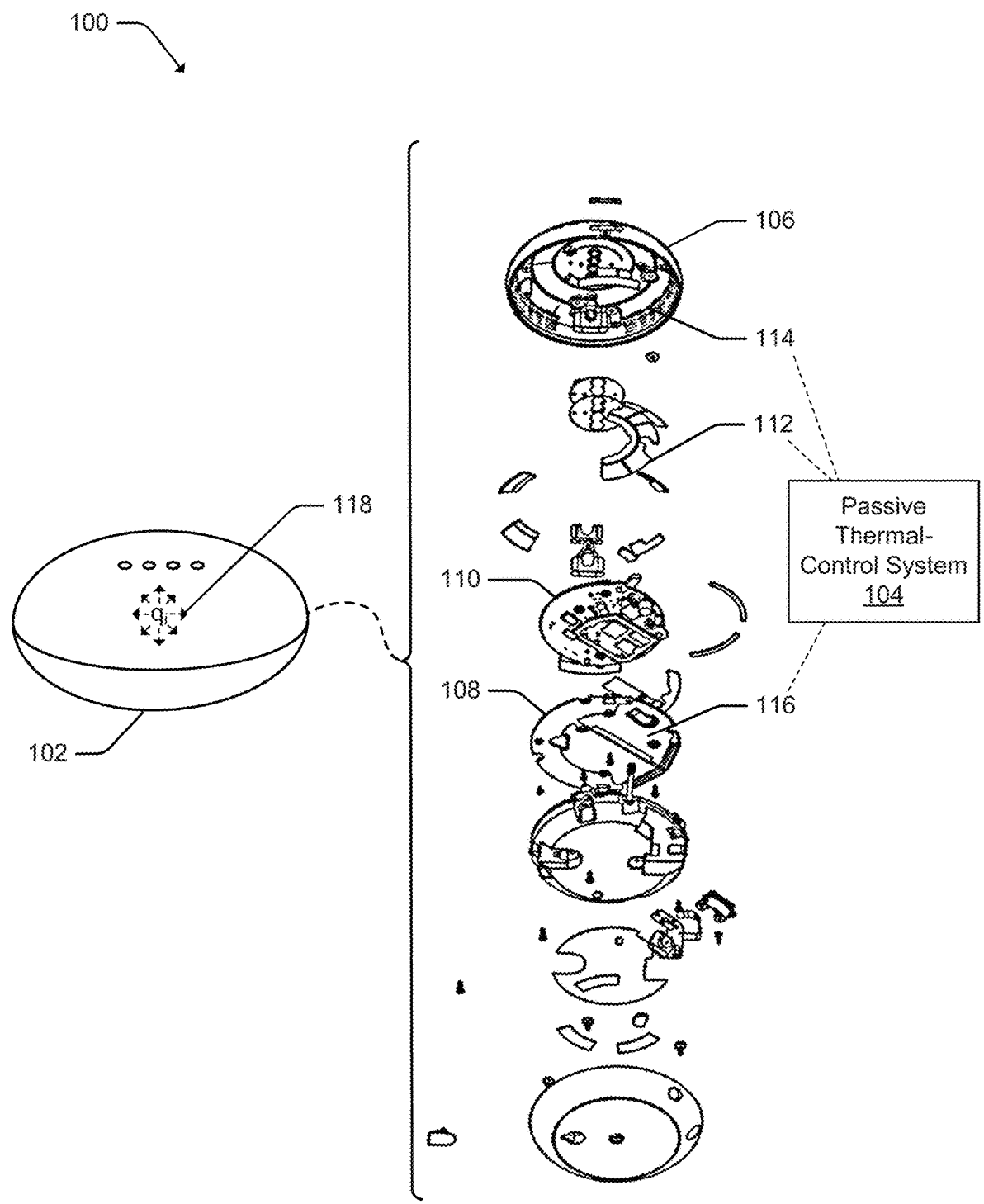
FIG. 1 illustrates details of an example operating environment having an example electronic speaker device in accordance with one or more aspects.

This document describes a passive thermal-control system that can be integrated into an electronic speaker device and associated electronic speaker devices. The passive thermal-control system uses an architecture that combines heat spreaders and thermal interface materials to transfer heat from heat-generating electronic devices of the electronic speaker device to a housing component of the electronic speaker device. The housing component then dissipates the heat to prevent a thermal runaway condition.

Heat transfer, in general, is energy that is in transit due to a temperature difference. If one or more temperature differences exist across devices of a system, such as the electronic speaker device, heat (e.g., energy in Joules) will transfer from higher temperature zones to lower temperature zones to reduce the temperature differences. There are several mechanisms for heat transfer across the devices of the system to minimize temperature differences, including convection, radiation, and conduction.

Convection, or heat transfer from a surface due to movement of molecules within fluids such as gases and liquids, may be quantified by equation (1) below:

$$q_{conv} = hA(T_s - T_\infty) \quad (1)$$

For equation (1), $q_{conv}$ represents a rate of heat transfer from a surface through convection (e.g., in Joules per second or Watts (W)), h represents a convection heat transfer coefficient (e.g., in W per meter squared (W/m²)), $T_s$ represents a temperature of a surface (e.g., in Kelvin (K) or degrees Celsius (° C.)), and $T_\infty$ represents a temperature of a fluid (e.g., in K or ° C.) to which the surface is exposed. The term A represents an area of a surface (e.g., in m²).

Radiation, or heat transfer from a surface through electromagnetic radiation, may be quantified by equation (2) below:

$$q_{rad} = \varepsilon A \sigma (T_s^4 - T_{surr}^4) \quad (2)$$

For equation (2), $q_{rad}$ represents a rate of heat transfer through radiation (e.g., in W), $\varepsilon$ represents emissivity (dimensionless), $\sigma$ represents the Stefen-Boltzmann constant (e.g., $\sigma = 5.67 \times 10^{-8}$ W/(m²·K⁴)), $T_s$ represents a temperature of a surface (e.g., in K or ° C.), and $T_{surr}$ represents a temperature of surroundings of the surface (e.g., in K or ° C.). The term A represents an area of the surface (e.g., in m²).

Conduction, or heat transfer through a solid body through atomic and molecular activity, may be quantified by equation (3) below:

$$q_{cond} = -kA \frac{dT}{dx} \quad (3)$$

For equation (3), $q_{cond}$ represents a rate of heat transfer in a solid material through conduction (e.g., in W), k represents a thermal conductivity of the solid material (e.g., in W/(m·K)), and dT/dx represents a temperature gradient through the solid material (e.g., in K/m or ° C./m). The term A represents a cross-sectional area of the solid material (e.g., in m²).

In instances of heat transfer from one physical body to another, through one or more of a convection heat-transfer mechanism, a radiation heat-transfer mechanism, or a conduction heat-transfer mechanism, the physical bodies may be in thermal contact. In some instances, this can include direct physical contact between the bodies or a material (e.g., a TIM) located between the bodies, enabling conduction-based heat transfer between the bodies. In other instances, this can include an air gap between the bodies that enables convection-based and/or radiation-based heat transfer between the bodies.

An electronic speaker device may include a passive thermal-control system that transfers heat using one or more of the heat-transfer mechanisms described above. In general, and in accordance with equations (1) and (2), rates and/or quantities of heat transfer can be varied by increasing or decreasing surface areas for convection and/or radiation within the electronic speaker device (e.g., increasing or decreasing surface areas of heat spreaders). In accordance with equation (3) and within the passive thermal-control system, rates and/or quantities of heat transfer can also be varied by introducing, between surfaces, one or more TIMs that have a high thermal conductivity.

Through conduction, convection, and/or radiation heat-transfer mechanisms, as described and quantified by equations (1)-(3) above, the passive thermal-control system may transfer heat originating from heat-generating electronic devices within the electronic speaker device to an interior surface of a housing component of the electronic speaker device. An exterior surface of the housing component may then dissipate the heat to an external environment through convection and/or radiation, effective to prevent a thermal runaway condition.

While features and concepts of the described passive thermal-control system for an electronic speaker device and associated electronic speaker devices can be implemented in any number of different environments and devices, aspects are described in the context of the following examples.

FIG. 1 illustrates an example operating environment 100 and an exploded view of an example electronic speaker device 102 having a passive thermal-control system 104. In some instances, the electronic speaker device 102 may wirelessly connect to a wireless local area network (WLAN) using a wireless communication protocol (e.g., IEEE 802.22 (Wi-Fi)). Applications available through the electronic speaker device 102 and/or the WLAN (e.g., a remote cloud-computing application or service) may support a variety of functions, such as streaming audio (e.g., music, news, podcasts, sports) or interacting with a virtual assistant to perform tasks (e.g., search the Internet, schedule events and alarms, control home automation, control internet-of-things (IoT) devices).

The electronic speaker device 102 includes several elements, including a housing component 106, an acoustic waveguide 108, and a PCB 110. The housing component 106 may form a portion of an oblate spheroid and, in some instances, include a substantially planar base. The acoustic waveguide 108 may be substantially planar and generally elliptical in shape. The PCB 110 may be substantially planar and generally elliptical in shape.

The housing component 106 may be perforated and include openings through which audio waves can travel (e.g., audio waves originating internally from a speaker of the electronic speaker device 102 or originating externally from a user of the electronic speaker device 102). The housing component 106 may include a plastic material and be formed, for example, using plastic injection molding techniques. The acoustic waveguide 108 may guide the audio waves to a microphone and from the speaker within the electronic speaker device 102. In some instances, the acoustic waveguide 108 may include a plastic material.

The PCB 110 may be formed, for example, using a glass-fiber-reinforced epoxy material (e.g., FR4). In some instances, the PCB 110 may include a single layer of electrically conductive traces and be a single-layer board. In other instances, the PCB 110 may be a multi-layer board that includes multiple layers of electrically conductive traces that are separated by layers of a dielectric material.

Multiple heat-generating electronic devices may be mounted to the PCB 110 and connected to the electrically conductive traces using surface mount and/or through-hole solder techniques. Example heat-generating electronic devices mounted to the PCB 110 include an SoC IC device, one or more memory devices, and audio-amplifier inductors. In some instances, each of the one or more memory devices may be a double data-rate random access (DDR DRAM) memory device. The multiple heat-generating electronic devices may further be mounted onto opposite surfaces of the PCB 110 (e.g., the SoC IC device and the memory IC devices may be mounted to a first surface of the PCB 110, while the audio-amplifier inductors may be mounted to a second, opposite surface of the PCB 110). In some instances, the PCB 110 may also include an electromagnetic interference (EMI) shield that surrounds heat-generating electronic devices such as the SoC IC device and the IC memory IC devices.

In general, the PCB 110 (including the multiple heat-generating electronic devices) may be considered an electronic subassembly of the electronic speaker device 102. While the electronic speaker device 102 is operating, the multiple heat-generating electronic devices may generate heat that, if not dissipated quickly, can damage the electronic speaker device 102.

This damaging situation, referred to as a thermal runaway condition, can have destructive impacts to the electronic speaker device 102 that include, for example, delamination of the PCB 110 and/or shortened life of devices of the electronic speaker device 102 (e.g., the SoC IC device, the memory IC devices, the audio-amplifier inductors, Wi-Fi devices, communication interfaces). In some instances, an operating temperature of the electronic speaker device 102 may exceed a prescribed temperature threshold, causing the electronic speaker device 102 to simply shut down (e.g., a thermocouple or other temperature sensing device may provide feedback to a processor or temperature-control unit of the electronic speaker device 102 and cause a thermal shut down).

To prevent the thermal runaway condition, the electronic speaker device 102 includes the passive thermal-control system 104 (e.g., a thermal-control system that is absent of active devices such as a powered fan, a powered pump exchanging fluids, and so on). The passive thermal-control system 104 includes multiple features, such as a first heat spreader 112 (e.g., a heat spreader in thermal contact with the housing component 106), a second heat spreader 114 (e.g., a heat spreader in thermal contact with components populating the PCB 110), and a third heat spreader 116 (e.g., a heat spreader in thermal contact with the acoustic waveguide 108). The passive thermal-control system 104 may also include one or more TIMs that are located between surfaces of the heat-generating electronic devices and other elements of the passive thermal-control system 104 to provide a thermally conductive path, reduce air gaps, and lessen thermal resistance. Assembly techniques can integrate elements of the passive thermal-control system 104 of the electronic speaker device 102 to maintain a desired form factor and provide a desired thermal performance (e.g., a desired thermal response or temperature profile while the electronic speaker device 102 is operating).

The elements of the passive thermal-control system 104, through a combination of heat-transfer mechanisms internal to the electronic speaker device 102 (e.g., conduction, convection, radiation), may transfer an internal heat load 118 (e.g., $q_i$ in W) from heat-generating electronic devices of the electronic speaker device 102 to the housing component 106 for dissipation to the surrounding operating environment 100 (e.g., dissipated using radiation and/or convection heat-transfer mechanisms).

In one example instance, the passive thermal-control system 104 may prevent a thermal runaway condition as the electronic speaker device 102 operates under the internal heat load 118 corresponding to a system power of up to 5 W. In this first example instance, a temperature (e.g., an ambient temperature) of the surrounding operating environment 100 may be approximately 35° C. and the passive thermal-control system 104 may spread, transfer, and dissipate heat to maintain a first temperature profile (e.g., a first temperature profile of heat-generating electronic devices of the electronic speaker device 102) that is less than approximately 65° C.

In another example instance, the passive thermal-control system 104 may prevent thermal runaway as the electronic speaker device 102 operates under another internal heat load 118 corresponding to a system power of up to 7.5 W. In this second example instance, a temperature (e.g., an ambient temperature) of the surrounding operating environment 100 may be approximately 35° C. and the passive thermal-control system 104 may spread, transfer, and dissipate heat to maintain a second temperature profile (e.g., a second temperature profile of heat-generating electronic devices of the electronic speaker device 102) that is less than approximately 95° C.

Figure 2:
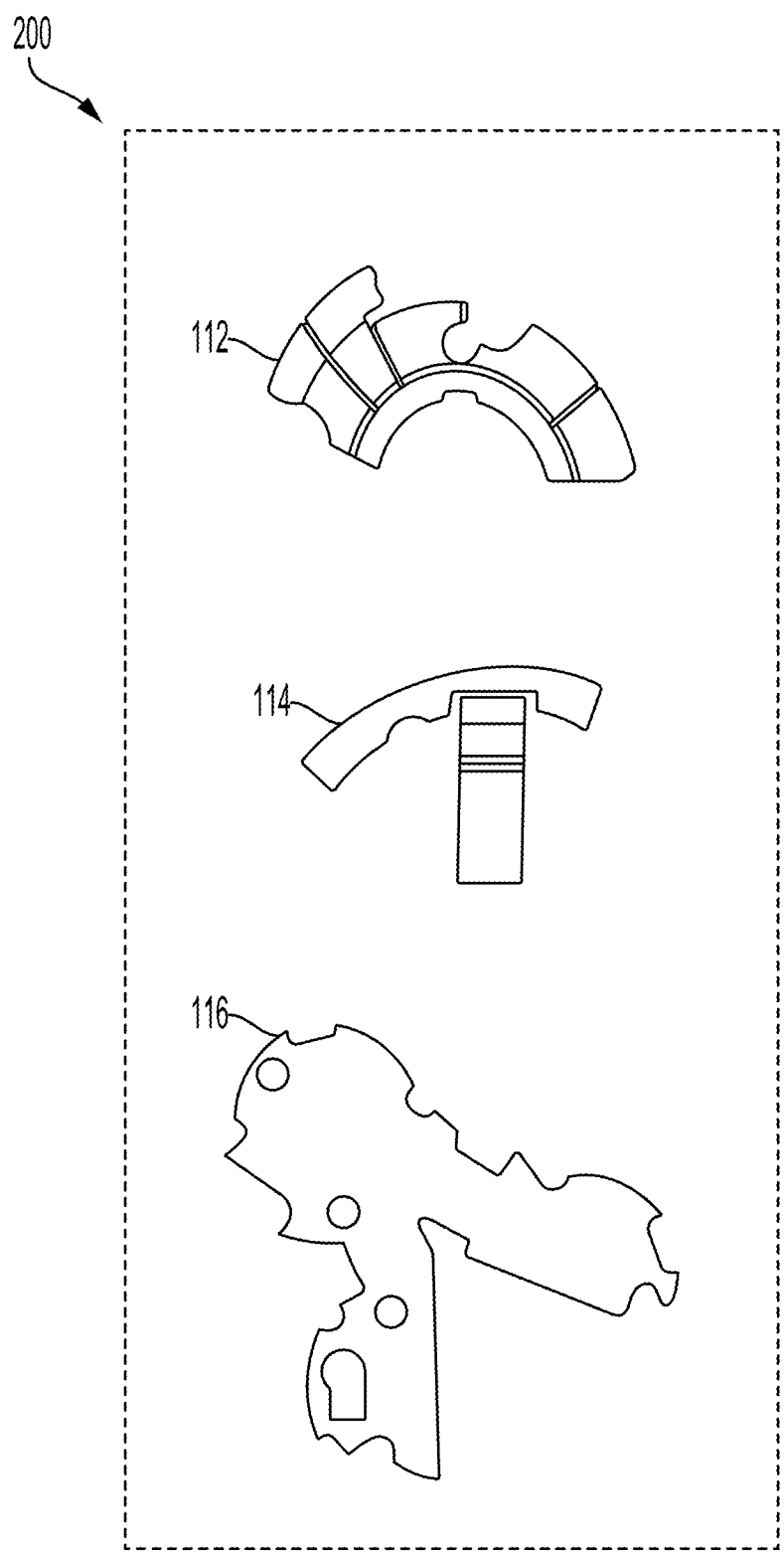
FIG. 2 illustrates details of an example passive thermal-control system of an electronic speaker device in accordance with one or more aspects.

FIG. 2 illustrates a magnified view 200 of features included in the passive thermal-control system 104 of FIG. 1. The magnified view 200 includes the first heat spreader 112, the second heat spreader 114, and the third heat spreader 116. The third heat spreader 116 is foldable along a portion of a perimeter of an acoustic waveguide (e.g., the acoustic waveguide 108 of FIG. 1) and is illustrated in an unfolded (e.g., flattened) view.

In general, each of the respective heat spreaders may each include one or more materials with high thermal-conduction properties. Example materials include graphite sheet materials, copper foil materials, and so on.

Figure 3:
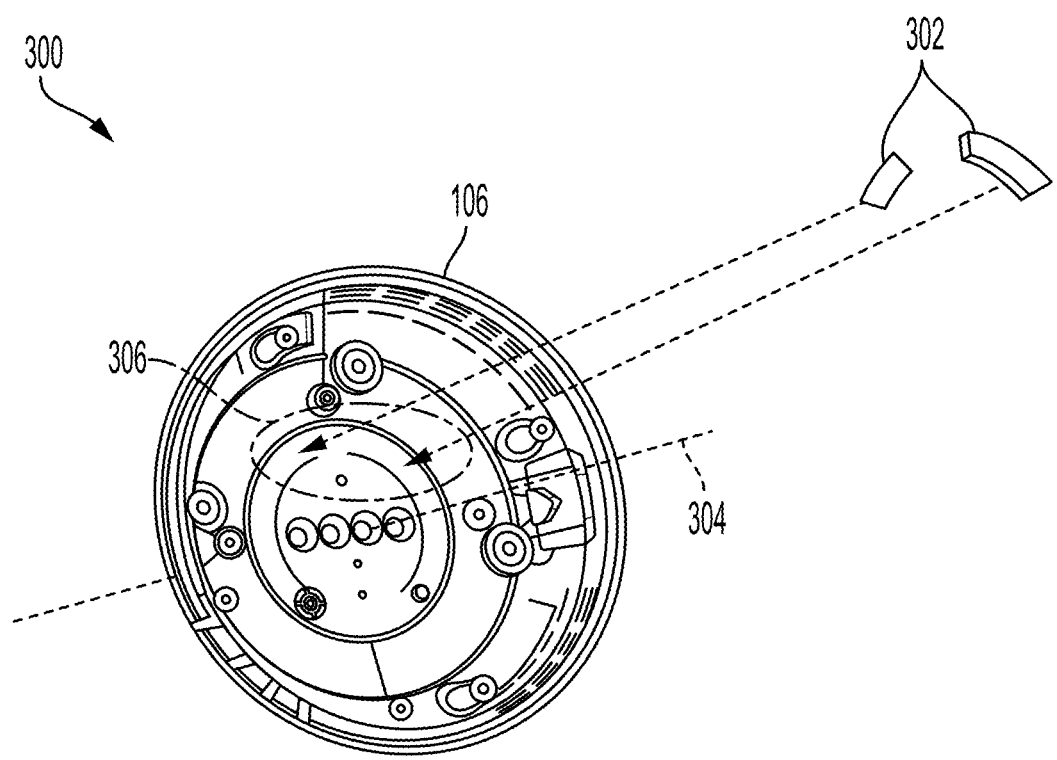
FIG. 3 illustrates details of an example TIM used as part of a passive thermal-control system of an electronic speaker device.

FIG. 3 illustrates details 300 of the housing component 106 and an example TIM 302 that may be used as part of a passive thermal-control system (e.g., the passive thermal-control system 104 of FIG. 1). The housing component 106, as illustrated in FIG. 3, may form a portion of a generally oblate spheroid shell, and in some instances may generally be symmetrical about a central axis 304.

As illustrated, the passive thermal-control system may include a TIM 302 located planar region 306 of the housing component 106 (e.g., located in a planar region corresponding to the first heat spreader 112 of FIGS. 1 and 2). The planar region 306, in general, is orthogonal to the central axis 304. In some instances, different portions of the TIM 302 may be in thermal contact with heat-generating devices mounted to a PCB (e.g., audio-amplifier inductors mounted to the PCB 110 of FIG. 1).

Some examples of the TIM 302 include a thermally conductive gel or grease material, a thermally conductive foam material, or a thermal pad. In general, the use of the TIM 302 may reduce air gaps and/or bond line gaps while providing a thermal conduction path between the heat-generating devices and the housing component 106.

In some instances, elements of an electronic speaker device (e.g., the electronic speaker device 102 of FIG. 1) may be located proximate to the housing component 106 in one or more planes that are orthogonal about the central axis 304. For example, an acoustic waveguide and a PCB (e.g., the acoustic waveguide 108 and the PCB 110 of FIG. 1) may be located proximate to the housing component 106 in parallel planes that are orthogonal to the central axis 304.

Figure 4:
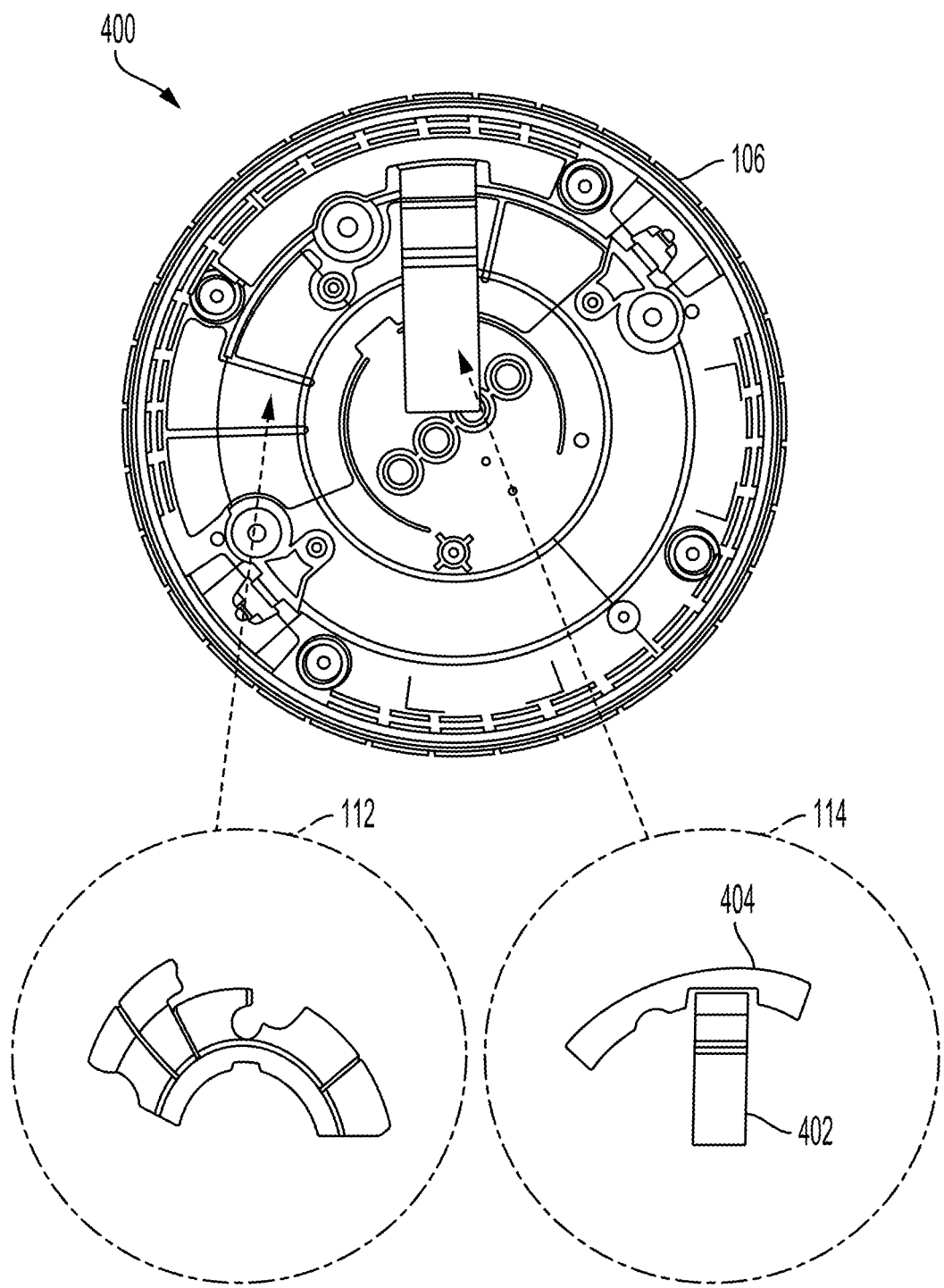
FIG. 4 illustrates details of example heat spreaders that spread heat and transfer heat to a housing component of an electronic speaker device.

FIG. 4 illustrates details 400 of example heat spreaders that spread and transfer heat to the housing component 106. The heat spreaders may include the first heat spreader 112 and the second heat spreader 114.

The first heat spreader 112 may include a graphite material and/or a copper material. The first heat spreader 112 may be fixed to, and in thermal contact with, an interior surface of the housing component 106. The first heat spreader 112 may, in general, be shaped like a segment of a ring having an exterior radius and an interior radius. Additionally, and when fixed to the interior surface of the housing component 106, the first heat spreader 112 may conform to a curvature of the interior surface of the housing component 106. The first heat spreader 112 may spread and transfer heat (e.g., heat from the heat-generating devices of the PCB 110 of FIG. 1) to the interior surface of the housing component 106 for eventual dissipation through an exterior surface of the housing component 106.

The second heat spreader 114 may include a graphite material and/or a copper material. The second heat spreader 114 may be in thermal contact with one or more IC devices that may be mounted to a PCB (e.g., the PCB 110 of FIG. 1). The second heat spreader 114 may also be in thermal contact with the interior surface of the housing component 106.

The second heat spreader 114 includes a first portion 402 that traverses across surface profiles of the IC devices and is in thermal contact with surfaces of the IC devices. The first portion 402 may, in general, be shaped like a segment of a ring having an exterior radius and an interior radius. When fixed to the interior surface of the housing component 106, the first portion 402 may conform to a curvature of the interior surface of the housing component 106. In some instances, a TIM may be located between the first portion 402 and the IC devices to enhance thermal conductivity. In some instances, the first portion 402 may include a polyethylene terephthalate (PET) film material that is attached to surfaces of the first portion 402.

The second heat spreader 114 also includes a second portion 404 that is in thermal contact with the interior surface of the housing component 106. The second portion 404 may, in general, be rectangular in shape. The second heat spreader 114 may spread and transfer heat from the IC devices to the interior surface of the housing component 106 for eventual dissipation to a surrounding environment. In some instances, the second portion 404 may include an aluminum foil material that is attached to surfaces of the second portion 404.

Figure 5:
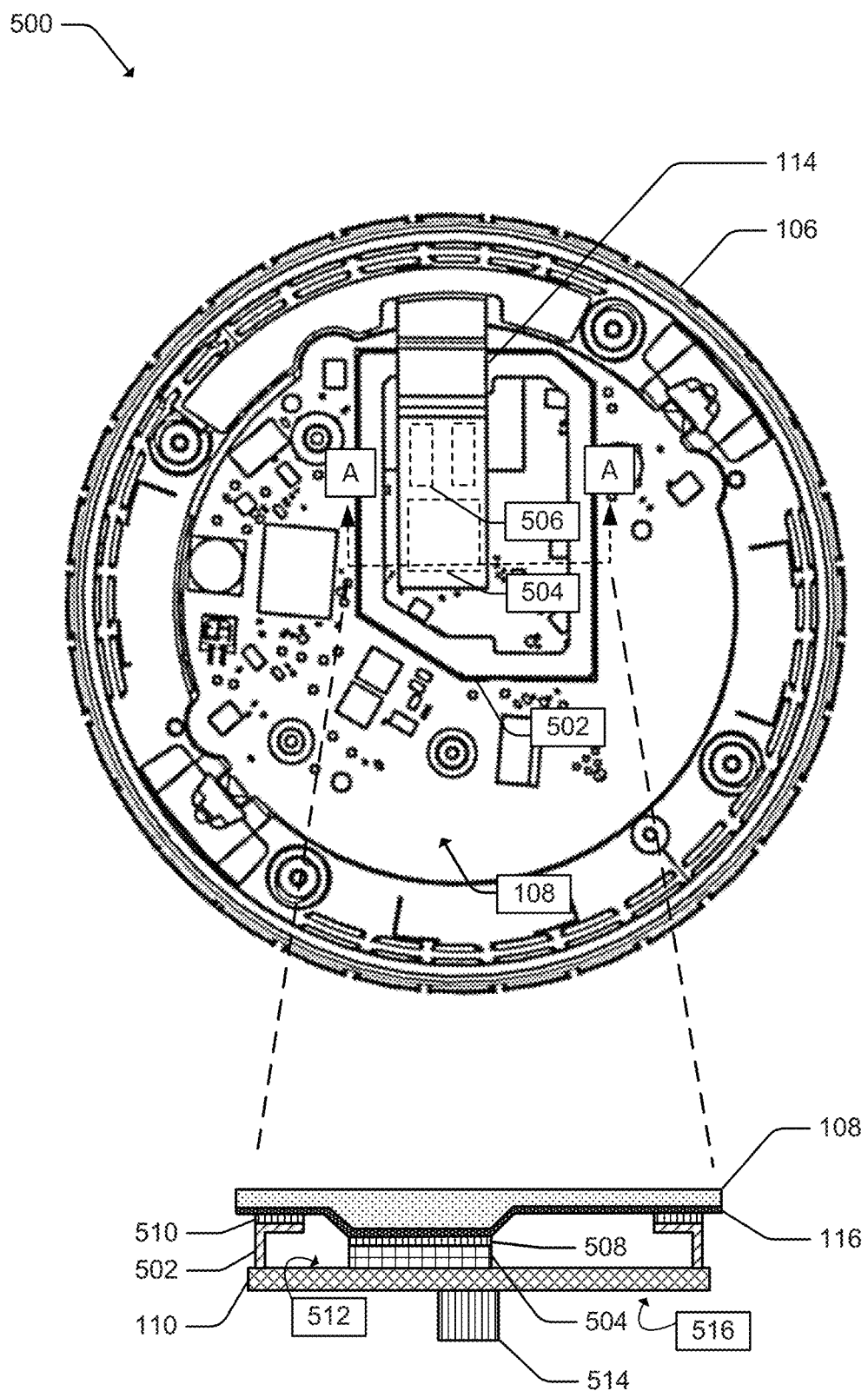
FIG. 5 illustrates details of an example structure used to transfer heat from electronic devices mounted on a printed circuit board to an acoustic waveguide.

FIG. 5 illustrates details 500 of an example structure used to transfer heat from electronic devices mounted on a printed circuit board to an acoustic waveguide. The example structure may include the PCB 110 of FIG. 2, the acoustic waveguide 108 of FIG. 1, the second heat spreader 114 of FIG. 2, the third heat spreader 116 of FIG. 2, and an EMI shield (e.g., an EMI shield 502).

As illustrated in the top view of FIG. 5, the EMI shield 502 is attached to the PCB 110 (e.g., epoxied to the PCB 110). Furthermore, the EMI shield 502 has an interior perimeter that surrounds at least one IC device mounted to the PCB 110 (e.g., an SoC IC device 504 and one or more memory IC device(s) 506, hidden and "under" the second heat spreader 114). The EMI shield 502, in general, absorbs electromagnetic interferences in proximity of the SoC IC device 504 and the memory IC device(s) 506.

Examples of materials that may be used to fabricate the EMI shield 502 include aluminum, copper, nickel, and stainless steel. In some instances, selection of the material used to fabricate the EMI shield 502 may account for a thermal conductivity property of the material.

The bottom view of FIG. 5 includes section-view A-A. Section-view A-A illustrates a cross-section of the structure in a region corresponding to the EMI shield 502. Section-view A-A also incorporates a portion of the acoustic waveguide 108 (not illustrated in the top view). A bottom surface of the acoustic waveguide 108 includes portions of the third heat spreader 116. The third heat spreader 116 may include a graphite material and/or a copper material.

As illustrated in section-view A-A, the structure includes the PCB 110, an IC device mounted to the PCB 110 (e.g., the SoC IC device 504), and an EMI shield 502 (e.g., an interior perimeter of the EMI shield 502) is surrounding the SoC IC device 504. Also, as illustrated in section view A-A, a first TIM (e.g., TIM 508) is located between the SoC IC device 504 and a portion of the third heat spreader 116. A second TIM (e.g., TIM 510) is located between the EMI shield 502 and another portion of the third heat spreader 116.

In the context of FIG. 5, the first TIM 508 or the second TIM 510 may include combinations of a thermally conductive foam material, a thermally conductive gel material, or a thermally conductive grease material. As an example, in one instance, the first TIM 508 may include a thermally conductive grease material or thermally conductive gel material, while the second TIM 510 may include a thermally conductive foam material. As another example, the first TIM 508 may include a thermally conductive grease material or thermally conductive gel material, while the second TIM 510 may include a thermally conductive foam material.

Different combinations of TIMs are possible while assembling the structure of FIG. 5. In some instances, the structure of FIG. 5 may also include a pressure-sensitive adhesive (PSA). For example, a PSA may coat exterior surfaces of the first TIM 508 if the first TIM 508 includes a thermally conductive foam material.

In some instances, and as also illustrated in FIG. 5, the PCB 110 may be a double-sided PCB that is populated with heat-generating devices on opposite surfaces. For example, while the SoC IC device 504 is mounted to a first surface 512 of the PCB 110, one or more audio-amplifier inductor(s) 514 may be mounted to a second surface 516 that is opposite the first surface 512. A portion of a TIM (e.g., a portion of the TIM 302 of FIG. 3) may be located between the devices on the second surface 516 of the PCB 110 (e.g., the one or more audio-amplifier inductor(s) 514) and another surface (e.g., a surface of the first heat spreader 112 of FIG. 2).

Furthermore, FIG. 5 illustrates a possible arrangement of the acoustic waveguide 108 relative to the PCB 110. For example, and as illustrated, the first surface 512 onto which the SoC IC device 504 is populated faces the acoustic waveguide 108.

Figure 6:
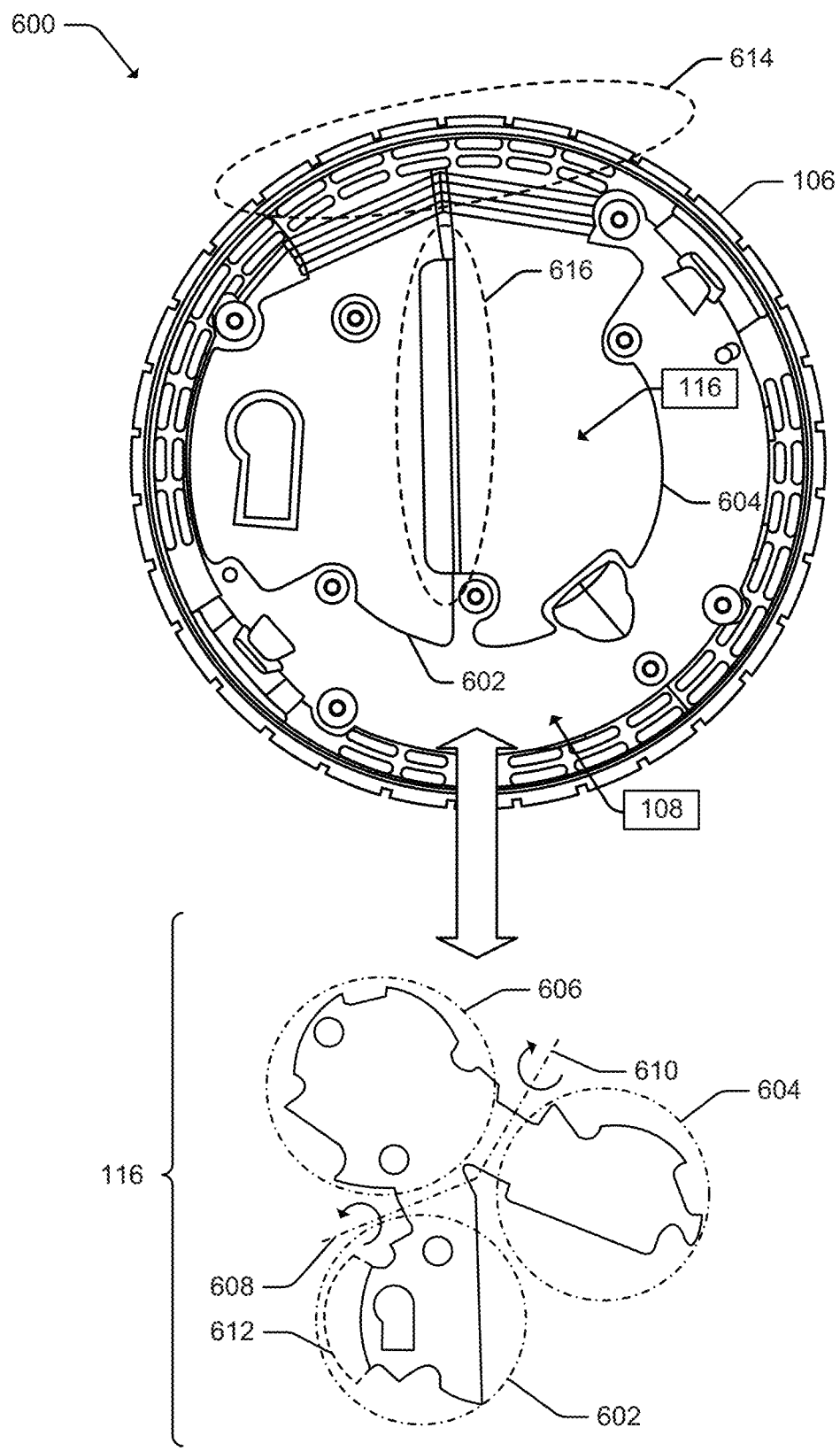
FIG. 6 illustrates details of an example heat spreader that may be part of an acoustic waveguide.

FIG. 6 illustrates details 600 of an example heat spreader that may be part of the acoustic waveguide 108. The heat spreader may be the third heat spreader 116 of FIG. 2.

As illustrated by FIG. 6, the acoustic waveguide 108 is assembled into the housing component 106. The third heat spreader 116 may include graphite and/or copper materials that are foldable along a portion of a perimeter of the acoustic waveguide. The third heat spreader 116 includes a first portion 602, a second portion 604, and a third portion 606. In aspects, the first portion 602 and the second portion 604 are each connected to the third portion 606, and the first portion 602 is not connected to the second portion 604. Further, a first flexible area connecting the first portion 602 to the third portion 606 may be proximate to a second flexible area connecting the second portion 604 to the third portion 606. However, the first portion 602 and the second portion 604 may be located at any suitable location around the perimeter of the third portion 606.

Folding and attaching the third heat spreader 116 to the acoustic waveguide 108 may include folding the different portions (e.g., first portion 602, second portion 604) of the third heat spreader 116 around different axes and attaching folded and unfolded portions to opposite surfaces of the acoustic waveguide 108. As an example, the first portion 602 may fold around a first folding-axis 608 while the second portion 604 may fold around a second folding-axis 610. Continuing, the first portion 602 (e.g., folded) and the second portion 604 (e.g., folded) attach to a surface of the acoustic waveguide 108, while the third portion 606 (e.g., unfolded) attaches to an opposite surface of the acoustic waveguide 108. The folding of the first portion 602 about the first folding-axis 608 and the second portion 604 about second folding-axis 610 effectuate a folding of the third heat spreader 116 about a portion 614 of a perimeter of the acoustic waveguide 108. Respective shapes of the first portion 602, second portion 604, and third portion 606 may include multiple radiuses and/or holes to avoid interferences with features that may be present in regions of attachment to the surfaces of the acoustic waveguide 108.

Attaching the portions of the third heat spreader 116 (e.g., the first portion 602, the second portion 604, the third portion 606) to the acoustic waveguide 108 may include using an epoxy material, a PSA material, and so on. After attachment, the first portion 602 and the second portion 604 share an overlapping region 616.

In general, the example of the third heat spreader 116 of FIG. 6 can be referred to as a "double-flap" configuration. The double-flap configuration of FIG. 6 affords a substantially round shape of the acoustic waveguide 108, reducing tooling setups and manufacturing costs of the acoustic waveguide 108. In this instance, the round shape of the acoustic waveguide 108 also increases available surface area of the acoustic waveguide 108 in comparison to other potential shapes of the acoustic waveguide 108 (e.g., other shapes of the acoustic waveguide 108 may include a truncated radius or a square edge). This increase in available surface area improves heat transfer performance (conduction, convection, radiation) of the third heat spreader 116 attached to the acoustic waveguide 108.

The third heat spreader 116 of FIG. 6 may also include features such as one or more wings (e.g., wing 612, illustrated as a dashed line) that extend beyond a perimeter of the acoustic waveguide 108 and that are in thermal contact with an interior surface of the housing component 106. Fabricating the third heat spreader 116 to include selective materials can, in some instances, tune heat transfer performance of the third heat spreader 116 (e.g., fabricating the third heat spreader 116 to include a material with high emissivity (c) properties can improve thermal radiation performance of the third heat spreader 116).

Through such a combination of the aforementioned elements, the third heat spreader 116 of FIG. 6 can spread and transfer heat generated by IC devices (e.g., the SoC IC device 504 and the memory IC device(s) 506 of FIG. 5) to the housing component 106 for eventual dissipation external to the electronic speaker device 102 (e.g., dissipation through convection). The dissipation of the heat will prevent thermal runaway of heat-generating electronic devices of the electronic speaker device 102.

Figure 7:
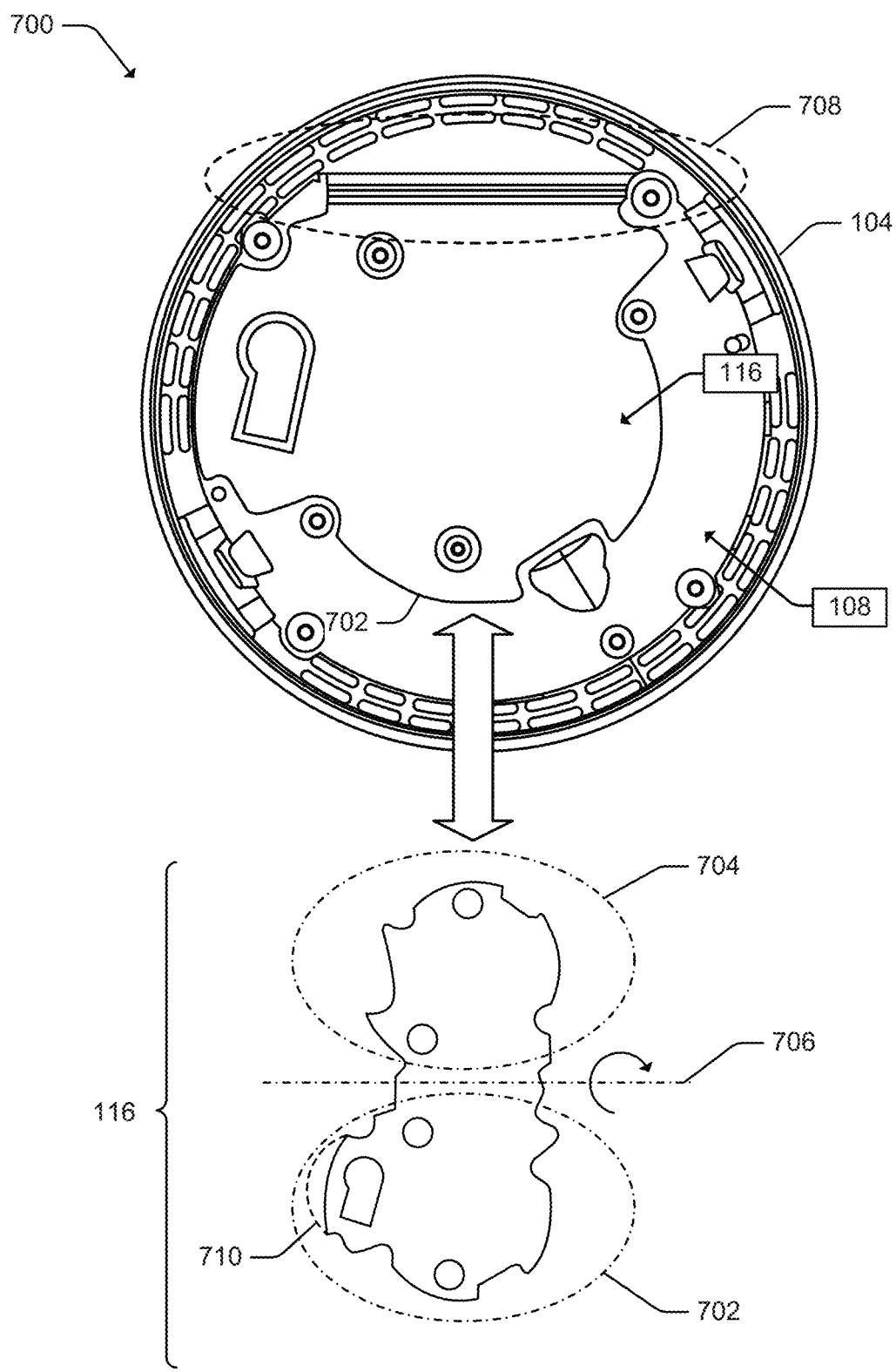
FIG. 7 illustrates details of another example heat spreader that may be part of an acoustic waveguide.

FIG. 7 illustrates details 700 of another example heat spreader that may be part of the acoustic waveguide 108. The heat spreader may be the third heat spreader 116 of FIG. 2.

As illustrated by FIG. 7, the acoustic waveguide 108 is assembled into the housing component 106. The third heat spreader 116 may include foldable graphite and/or copper materials. The third heat spreader 116 may include a first portion 702 and a second portion 704.

In the context of FIG. 7, attaching the third heat spreader 116 to the acoustic waveguide 108 may include folding portions of the third heat spreader 116 around an axis and attaching different portions of the third heat spreader 116 to opposite surfaces of the acoustic waveguide 108. As an example, the first portion 702 may fold around folding-axis 706. The folding of the third heat spreader 116 about the folding-axis 706 effectuates a folding of the third heat spreader 116 about a portion 708 of a perimeter of the acoustic waveguide 108.

Continuing, the first portion 702 may attach to a surface of the acoustic waveguide 108, while the second portion 704 may attach to an opposite surface of the acoustic waveguide 108. Attaching the portions of the third heat spreader 116 (e.g., the first portion 702 and the second portion 704) to the acoustic waveguide 108 may include using an epoxy material, a PSA material, and so on. Respective shapes of the first portion 702 and the second portion 704 may include multiple radiuses and/or holes to avoid interferences with features that may be present in regions of attachment to the surfaces of the acoustic waveguide 108.

In general, the example of the third heat spreader 116 of FIG. 7 can be referred to as a "single-flap" configuration (e.g., a single-flap folded about the folding-axis 706). The single-flap configuration of FIG. 7 may be desirable in instances where a reduction in cost of the third heat spreader 116 is desirable over costs and/or performance considerations with respect to the acoustic waveguide 108.

The third heat spreader 116 of FIG. 7 may also include features such as one or more wings (e.g., wing 710, illustrated as a dashed line) that extend beyond a perimeter of the acoustic waveguide 108 and that are in thermal contact with an interior surface of the housing component 106 to improve heat transfer from the acoustic waveguide 108 to the interior surface of the housing component 106. Depending on materials of the third heat spreader 116, the third heat spreader 116 may also be tuned to improve radiation (e.g., a material with high emissivity (c) properties may be chosen).

Through such a combination of the aforementioned elements, the third heat spreader 116 spreads and transfers heat generated by IC devices (e.g., the SoC IC device 504 and the memory IC device(s) 506 of FIG. 5) to the housing component 106 for eventual dissipation. The dissipation of the heat can contribute to preventing a thermal runaway condition.

Although techniques using and apparatuses for a passive thermal-control system of an electronic speaker device and associated electronic speaker devices are described, it is to be understood that the subject of the appended claims is not necessarily limited to the specific features or methods described. Rather, the specific features and methods are disclosed as example ways in which the passive thermal-control system of an electronic speaker device and associated electronic speaker devices can be implemented.

What is claimed is:

1. An electronic speaker device comprising:
   a housing component;
   an acoustic waveguide;
   a printed circuit board; and
   a passive thermal-control system to transfer heat generated by one or more integrated circuit devices on the printed circuit board to the housing component via the acoustic waveguide, the passive thermal-control system comprising a first heat spreader in thermal contact with the acoustic waveguide, the first heat spreader being folded along a portion of a perimeter of the acoustic waveguide such that the first heat spreader is in thermal contact with opposing surfaces of the acoustic waveguide.

2. The electronic speaker device of claim 1, wherein the passive thermal-control system further comprises a second heat spreader that is in thermal contact with the printed circuit board.

3. The electronic speaker device of claim 2, wherein the passive thermal-control system further comprises a thermally conductive gel material, the thermally conductive gel material:
- located between the printed circuit board and the second heat spreader; and
- in thermal contact with the printed circuit board and the second heat spreader.

4. The electronic speaker device of claim 2, wherein the second heat spreader includes at least one of a graphite material and a copper material.

5. The electronic speaker device of claim 1, wherein a first surface of the printed circuit board to which the one or more integrated circuit devices are mounted faces the acoustic waveguide.

6. The electronic speaker device of claim 5, wherein a second surface of the printed circuit board that is opposite the first surface of the printed circuit board includes an audio-amplifier inductor.

7. The electronic speaker device of claim 1, wherein the first heat spreader includes a single-flap that is folded along the portion of the perimeter of the acoustic waveguide.

8. The electronic speaker device of claim 7, wherein the first heat spreader includes one or more wings that are in thermal contact with an interior surface of the housing component.

9. The electronic speaker device of claim 7, wherein the first heat spreader includes at least one of a graphite material and a copper material.

10. The electronic speaker device of claim 1, wherein the first heat spreader includes a double-flap that is folded along the portion of the perimeter of the acoustic waveguide.

11. The electronic speaker device of claim 10, wherein the first heat spreader includes one or more wings that are in thermal contact with an interior surface of the housing component.

12. The electronic speaker device of claim 10, wherein the first heat spreader includes at least one of a graphite material and a copper material.

13. The electronic speaker device of claim 1, further comprising an electromagnetic interference shield that:
- is located between the printed circuit board and the acoustic waveguide; and
- surrounds the one or more integrated circuit devices.

14. The electronic speaker device of claim 13, wherein a thermally conductive foam is located between the electromagnetic interference shield and the first heat spreader.

15. The electronic speaker device of claim 13, wherein the electromagnetic interference shield includes at least one of an aluminum material, a copper material, a nickel material, and a stainless steel material.

16. The electronic speaker device of claim 1, further comprising:
- an audio-amplifier inductor located on a surface of the printed circuit board; and
- a thermal interface material that:
  - is in thermal contact with the audio-amplifier inductor; and
  - is located between the audio-amplifier inductor and a second heat spreader that is in thermal contact with the printed circuit board.

17. The electronic speaker device of claim 1, wherein the housing component forms a portion of an oblate spheroid shell.

18. The electronic speaker device of claim 1, wherein the acoustic waveguide is planar and has an elliptical shape.

19. The electronic speaker device of claim 1, wherein the printed circuit board is planar and has a shape that is elliptical.

20. The electronic speaker device of claim 1, wherein the printed circuit board includes a system-on-chip integrated circuit device and a memory integrated circuit device and wherein the passive thermal-control system includes a third heat spreader in thermal contact with the system-on-chip integrated circuit device and the memory integrated circuit device.

* * * * *